(12) United States Patent
Minakawa et al.

(10) Patent No.: US 7,652,358 B2
(45) Date of Patent: Jan. 26, 2010

(54) SEMICONDUCTOR DEVICE INCLUDING MAIN SUBSTRATE AND SUB SUBSTRATES

(75) Inventors: Atsushi Minakawa, Neyagawa (JP); Mamoru Sekiya, Neyagawa (JP); Norio Umezu, Neyagawa (JP)

(73) Assignee: Onkyo Corporation, Neyagawa (JP)

( * ) Notice: Subject to any disclaimer, the term of this patent is extended or adjusted under 35 U.S.C. 154(b) by 0 days.

(21) Appl. No.: 12/136,117

(22) Filed: Jun. 10, 2008

(65) Prior Publication Data

US 2009/0121342 A1  May 14, 2009

(30) Foreign Application Priority Data

Nov. 14, 2007  (JP) .............................. 2007-295203

(51) Int. Cl.
*H01L 23/495* (2006.01)

(52) U.S. Cl. ............... 257/675; 257/712; 257/E23.104; 257/E25.01; 257/E25.03; 257/707; 438/107; 438/110; 438/122; 361/783; 361/820

(58) Field of Classification Search ......... 257/710–713, 257/720, 722–724, E23.104, E25.03, 70–707, 257/777, 734, E25.01, 730–731, 796; 361/820, 361/783, 752–753, 704, 707, 715, 717–719, 361/723, 796; 165/185; 438/107, 110, 122
See application file for complete search history.

(56) References Cited

FOREIGN PATENT DOCUMENTS

| JP | 63-46899 | 3/1988 |
|---|---|---|
| JP | 02-164100 | 6/1990 |
| JP | 05-167277 | 7/1993 |
| JP | 06-037419 | 2/1994 |
| JP | 06-252282 | 9/1994 |
| JP | 09-139592 | 5/1997 |
| JP | 2004-172468 | 6/2004 |
| JP | 2005-166907 | 6/2005 |

*Primary Examiner*—Davienne Monbleau
*Assistant Examiner*—Shweta Mulcare
(74) *Attorney, Agent, or Firm*—Renner, Otto, Boisselle & Sklar, LLP (57) ABSTRACT

A semiconductor device according to a preferred embodiment of the present invention is a semiconductor device including a main substrate and one or more sub substrates, and the semiconductor device includes first heat generating devices mounted on the sub substrates, sub-substrate heatsinks mounted to the first heat generating devices, and a main-substrate heatsink mounted to the main substrate, wherein the sub-substrate heatsinks and the main-substrate heatsink are secured to each other, such that there is a predetermined positional relationship between the sub substrates and the main substrate.

7 Claims, 9 Drawing Sheets

SEMICONDUCTOR DEVICE INCLUDING MAIN SUBSTRATE AND SUB SUBSTRATES

BACKGROUND OF THE INVENTION

1. Field of the Invention

The present invention relates to a semiconductor device including two or more substrates.

2. Description of the Related Art

Large numbers of electronic components are used in semiconductor devices which have been developed in recent years, in order to realize higher performance. The numbers of substrates for use in mounting such electronic components tend to be increased, although the mounting densities of respective substrates have been increased. On the other hand, there are requirements for reduction of the sizes of semiconductor devices. To cope with these requirements, substrates have been stereoscopically assembled, in order to increase the mounting densities.

In cases where substrates are stereoscopically assembled, it is necessary that, to a substrate forming a base (hereinafter, referred to as a "main substrate"), other substrates (hereinafter, substrates secured to the "main substrate" will be referred to as "sub substrates") are secured.

However, in order to stabilize the position and the attitude of the sub substrates relative to the main substrate in assembling them, there is a need for dedicated jigs. In cases of assembling using dedicated jigs, there is induced inconvenience of increase of the number of assembling processes. Further, it is also possible to employ a method which uses additional securing members, but such a method induces the problem of increase of assembling processes due to the increase of the number of components and, further, induces the problem of increase of the material cost by an amount corresponding to the additional components.

The present invention was made in view of the aforementioned circumstances and aims at providing a semiconductor device which can be assembled through an assembling method capable of assembling for securing sub substrates to a main substrate without increasing the number of components and the number of processes.

SUMMARY OF THE INVENTION

A semiconductor device according to a preferred embodiment of the present invention is a semiconductor device including a main substrate and one or more sub substrates, and the semiconductor device includes first heat generating devices mounted on the sub substrates, sub-substrate heatsinks mounted to the first heat generating devices, and a main-substrate heatsink mounted to the main substrate, wherein the sub-substrate heatsinks and the main-substrate heatsink are secured to each other, such that there is a predetermined positional relationship between the sub substrates and the main substrate.

With this structure, the sub-substrate heatsinks and the main-substrate heatsink, which are mounted for releasing heat, are secured to each other, so that there is a predetermined positional relationship between the sub substrates and the main substrate. Therefore, this can eliminate the necessity of using dedicated jigs or additional dedicated securing members, in order to secure the sub substrates and the main substrate to each other such that there is a predetermined positional relationship between the sub substrates and the main substrate. This can reduce the number of assembling processes, in comparison with cases of using dedicated jigs as described above. Also, this can reduce the number of assembling processes and also can reduce the material cost, in comparison with cases of using additional dedicated securing members as described above.

In a preferred embodiment, the semiconductor device further comprise a second heat generating device mounted on the main substrate. The main-substrate heatsink is mounted to the second heat generating device.

In a preferred embodiment, the sub-substrate heatsinks and the main-substrate heatsink are secured to each other, such that the sub substrates and the main substrate are positioned orthogonally to each other.

In a preferred embodiment, the main-substrate heatsink is directly mounted to the main substrate.

In a preferred embodiment, the sub-substrate heatsinks have an L-shaped cross-sectional area, are mounted, at their one end portions, to the first heat generating devices such that the one end portions are parallel to the sub substrates and, also, are secured, at the other end portions, to the main-substrate heatsink.

In a preferred embodiment, the first heat generating devices are mounted on the sub substrates in parallel to the sub substrates.

In a preferred embodiment, the sub-substrate heatsinks have a rectangular shape, are mounted to the first heat generating devices orthogonally to the sub substrates, and directly secured to the main substrate.

In a preferred embodiment, the first heat generating devices are mounted on the sub substrates orthogonally to the sub substrates.

In a preferred embodiment, the sub-substrate heatsinks are directly mounted to the sub substrates.

In a preferred embodiment, the sub-substrate heatsinks have engagement portions, and the sub substrates are provided with engagement holes, such that the engagement portions are engaged with the engagement holes.

In a preferred embodiment, the engagement portions comprise first extending portions extended from the sub-substrate heatsinks in parallel to the sub substrates and second extending portions extended from the first extended portions orthogonally to the sub substrates. The sub-substrate heatsinks further have third extending portions extended from the sub-substrate heatsinks orthogonally to the sub substrates. The engagement portions and the third extended portions sandwich the sub substrates.

In a preferred embodiment, the semiconductor device further comprises a chassis to which the sub-substrate heatsinks or the main-substrate heatsink is secured.

In a preferred embodiment, the semiconductor device further comprises a heat conducting portion for transferring heat to a temperature sensor which is secured to the sub-substrate heatsinks or the main-substrate heatsink. The heat conducting portion is grounded.

In a preferred embodiment, each of the sub substrates is an amplifier substrate for a single channel and, when the semiconductor device comprises amplifiers for plural channels, the sub substrates and the sub-substrate heatsinks for the plural channels are provided.

A method for fabricating a semiconductor device according to a preferred embodiment of the present invention including a main substrate and one or more sub substrates, the method comprises the steps of: mounting sub-substrate heatsinks to first heat generating devices; mounting the first heat generating devices on the sub substrates; mounting a main-substrate heatsink to the main substrate; and securing the sub-substrate heatsinks and the main-substrate heatsink to each other, such that there is a predetermined positional relationship between the sub substrates and the main substrate.

DETAILED DESCRIPTION OF THE PREFERRED EMBODIMENTS

Hereinafter, preferred embodiments of the present invention will be described in detail, with reference to the drawings.

Figure 1:
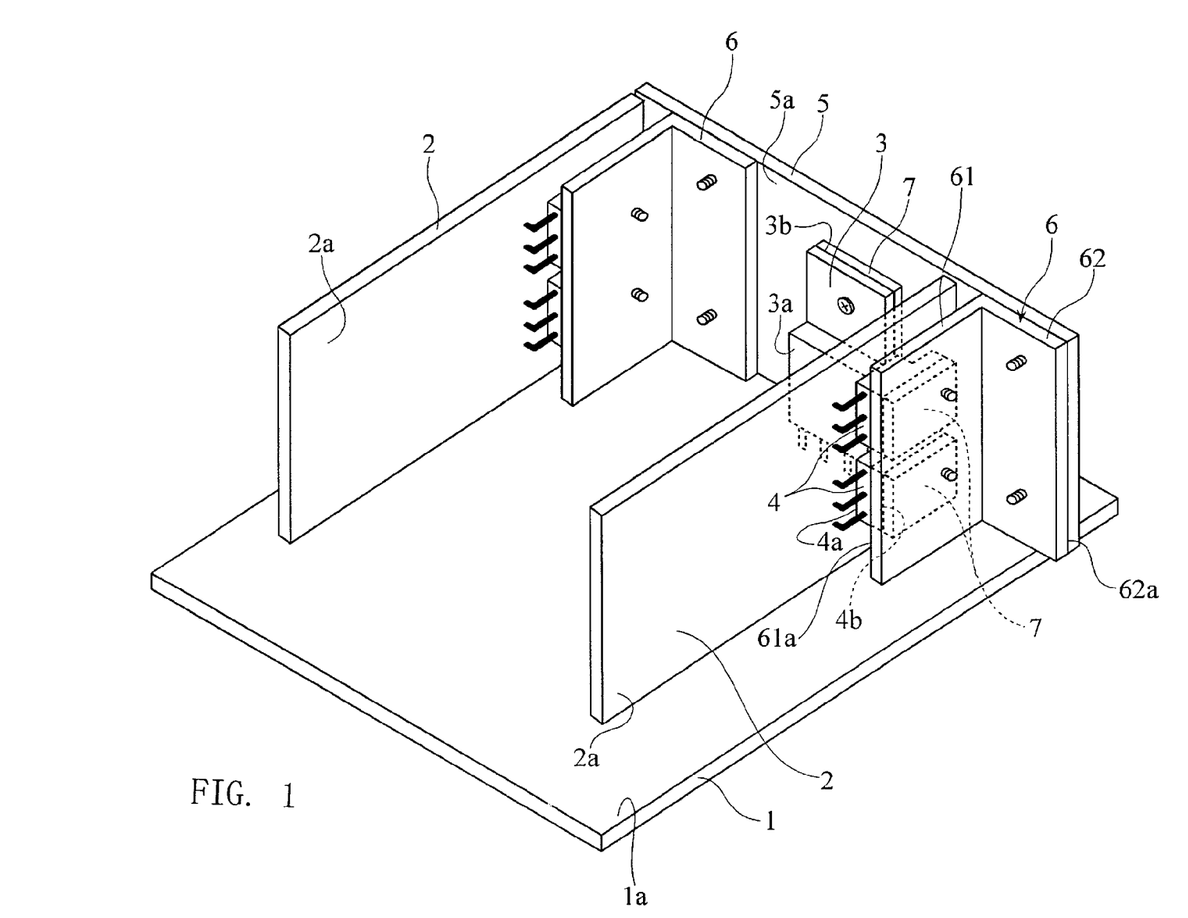
FIG. 1 is a view showing an internal structure of a first embodiment of a semiconductor device according to the present invention.
Figure 2:
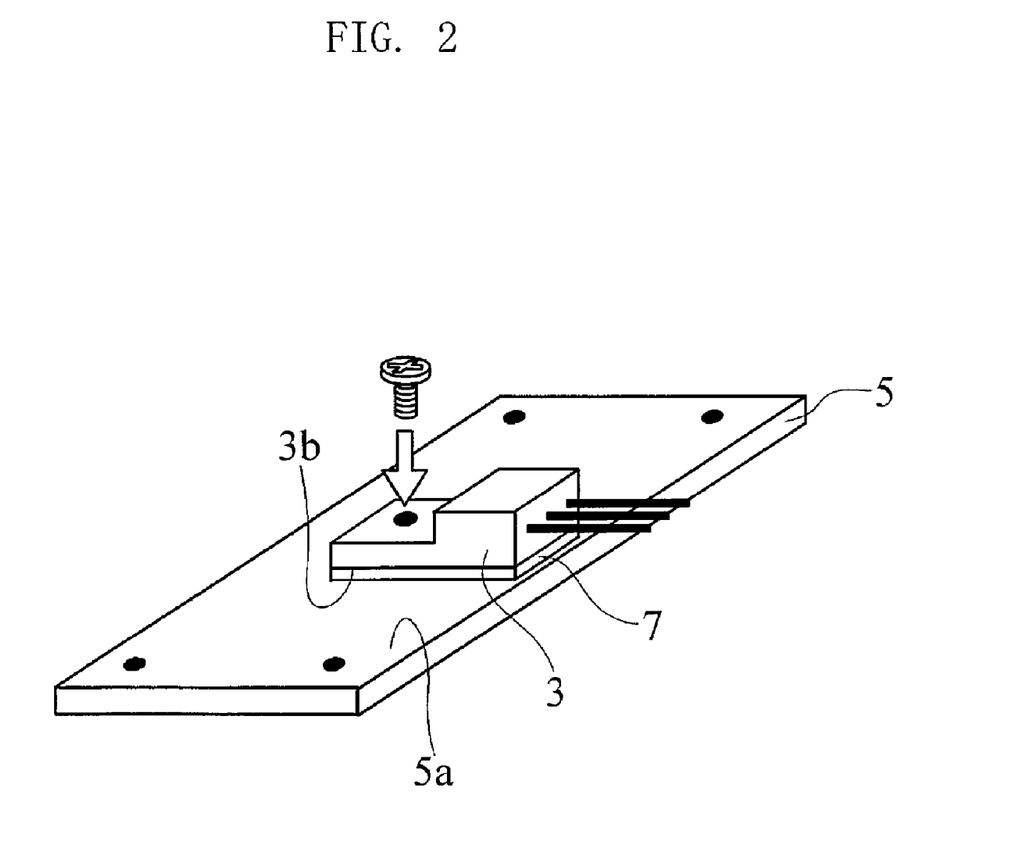
FIG. 2 is a view showing processes for securing a main-substrate heatsink to a power-supply rectification diode, in an example of a method for fabricating the semiconductor device shown in FIG. 1.
Figure 3:
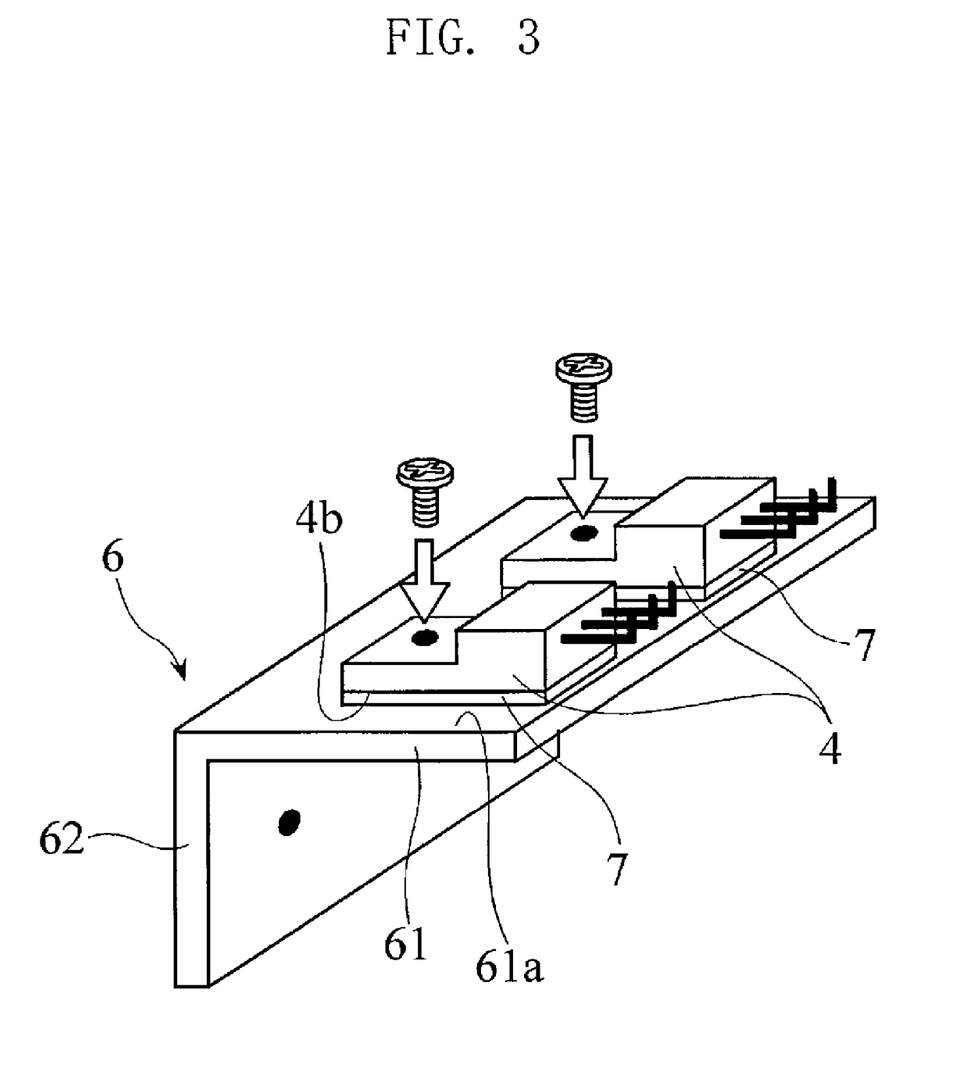
FIG. 3 is a view showing processes for securing sub-substrate heatsinks to power transistors, in the example of the method for fabricating the semiconductor device shown in FIG. 1.

FIG. 1 is a view showing an internal structure of a first embodiment of a semiconductor device according to the present invention. In FIG. 1, components which are not required to be described are not illustrated.

The semiconductor device includes a main substrate 1, sub substrates 2, a power-supply rectification diode 3, power transistors 4, a main-substrate heatsink 5, sub-substrate heatsinks 6, heat transfer sheets 7, and an outer case which is not illustrated.

The main substrate 1 is a power-supply substrate, and electronic components constituting a power supply device and electronic components for controlling are mounted on a mounting surface 1a thereof (the surface at the front side in FIG. 1). The respective electronic components are electrically interconnected, through wiring patterns provided on the mounting surface 1a and the back surface of the main substrate 1. In FIG. 1, the wiring patterns and the electronic components other than the power-supply rectification diode 3, which will be described later, are not illustrated. The power-supply device converts AC power supplied from a domestic power supply into DC power with a predetermined voltage. The main substrate 1 is a substrate which serves as a base for use in stereoscopically assembling the respective substrates.

The sub substrates 2 are amplifier substrates, and electronic components constituting amplification devices for amplifying sound signals are mounted on mounting surfaces 2a thereof (the surfaces at the front side in FIG. 1). The respective electronic components are electrically interconnected through wiring patterns provided on the mounting surfaces 2a and the back surfaces of the sub substrates 2. In FIG. 1, the wiring patterns and the electronic components other than the power transistors 4, which will be described later, are not illustrated. The amplification devices amplify input sound signals and output the amplified sound signals, using electric power supplied from the power supply device. The sub substrates 2 are placed on the mounting surface 1a of the main substrate 1 orthogonally thereto.

While, in the present embodiment, the two sub substrates 2 are placed on the main substrate 1 for providing amplifiers for two channels in the semiconductor device, in cases of providing an amplifier for a single channel, it is necessary to place only a single sub substrate 2 on the main substrate 1. Also, in cases of providing amplifiers for three or more channels, it is necessary to place a number of sub substrates 2 required for the number of channels on the main substrate 1. In this case, the main-substrate heatsink 5, which will be described later, should be extended in the direction of the longer sides (in the direction from the upper left portion to the lower right portion in FIG. 1) or the respective sub substrates 2 should be placed with smaller intervals interposed thereamong.

The power-supply rectification diode 3 is an electronic component mounted on the mounting surface 1a of the main substrate 1 and performs rectification for converting AC power supplied from the domestic power supply into DC power. The power-supply rectification diode 3 is a heat generating device which generates heat when it is energized.

The power transistors 4 are electronic components which are mounted on the mounting surfaces 2a of the sub substrates 2 by adhering one surfaces (the surfaces at the rear side in FIG. 1, and will be referred to as "surfaces" hereinafter) 4a thereof to the mounting surfaces 2a and amplify sound signals. In the present embodiment, two power transistors 4 are mounted on each sub substrate 2. The power transistors 4 are also heat generating devices which generate heat when they are energized.

The main-substrate heatsink 5 is for releasing heat generated from the power-supply rectification diode 3. The main-substrate heatsink 5 is a rectangular-shaped plate having longer sides with substantially the same length as that of the sides of the main substrate 1 in one direction (the sides in the direction from the upper left portion to the lower right portion in FIG. 1) and is made of a metal capable of easily transferring heat therethrough, such as aluminum. Further, screw holes are formed therein near the four corners and at substantially the center. Further the material and the shape of the main-substrate heatsink 5 is not limited to those described above. For example, the material thereof can be a metal such as iron or copper or a ceramic or resin having a lower thermal resistance. Further, the shape thereof can be properly designed according to the method for mounting the main-substrate heatsink 5 to the power-supply rectification diode 3 and the method for adhering the main-substrate heatsink 5 to the sub-substrate heatsinks 6, which will be described later.

The main-substrate heatsink 5 is mounted through a screw to one surface of the power-supply rectification diode 3 (the surface at the back side in FIG. 1 and will be referred to as a "back surface" hereinafter), at a substantially center position of one surface 5a thereof (the surface at the front side in FIG. 1), with a heat transfer sheet 7 which will be described later interposed therebetween. Also, the main-substrate heatsink 5 can be mounted thereto through other methods than mounting with a screw. For example, the main-substrate heatsink 5 can be directly mounted thereto through an adhesive agent with a lower thermal resistance, without interposing the heat transfer sheet 7 therebetween. Also, when no heat generating device such as the power-supply rectification diode 3 is mounted on the main substrate 1, the main-substrate heatsink 5 can be directly mounted to the main substrate 1.

The sub-substrate heatsinks 6 are for releasing heat generated from the power transistors 4. The sub-substrate heatsinks 6 are plates with an L-shaped cross-sectional area which are made of a metal with a lower thermal resistance, such as aluminum. Further, two screw holes are formed substantially at the center of each of an one-side part (the part in the left side in FIG. 1) 61 and the other-side part (the part in the right side in FIG. 1) 62, such that the screw holes are aligned in the direction of the border line between the one-side part 61 and the other-side part 62. The two screw holes formed in the other-side part 62 are provided, such that they are coincident with two screw holes in the main-substrate heatsink 5 which are aligned in the direction of the shorter sides of the main-substrate heatsink 5 (in the vertical direction in FIG. 1). Further, the material and the shape of the sub-substrate heatsinks 6 are not limited, similarly to the main-substrate heatsink 5.

The sub-substrate heatsinks 6 are mounted, through screws, to the other surfaces (the surfaces at the front side in FIG. 1 and will be referred to as "back surfaces" hereinafter) 4b of the two power transistors 4, with heat transfer sheets 7 interposed therebetween, at the outer surfaces (the surfaces at the back side in FIG. 1) 61a of the one-side parts 61. Also, the sub-substrate heatsinks 6 can be mounted thereto through other methods than mounting with screws, similarly to the main-substrate heatsink 5. Further, in cases where no heat generating devices such as the power transistors 4 are mounted on the sub substrates 2, the sub-substrate heatsinks 6 can be directly mounted to the sub substrates 2.

The sub-substrate heatsinks 6 are secured, with screws, to one surface 5a of the main-substrate heatsink 5, at the outer surfaces (the surfaces at the back side in FIG. 1) 62a of the other-side parts 62. Further, heat transfer sheets 7 can be interposed between the sub-substrate heatsinks 6 and the main-substrate heatsink 5 or the sub-substrate heatsinks 6 can be secured to the main-substrate heatsink 5 through other methods than securing with screws. For example, the sub-substrate heatsinks 6 can be directly adhered thereto with an adhesive agent with a lower thermal resistance or can be secured thereto by soldering or welding. However, in order to secure the sub substrates 2 orthogonally to the mounting surface 1a of the main substrate 1 at predetermined positions, it is most preferable to secure the sub-substrate heatsinks 6 to the main-substrate heatsink 5 with screws, which enables firmly securing them to each other at predetermined positions.

By securing as described above, the heat generated from the power transistors 4 and then transferred to the sub-substrate heatsinks 6 can be released through the main-substrate heatsink 5 which has a larger surface area and offers a higher heat-releasing effect than that of the sub-substrate heatsinks 6. Also, the main-substrate heatsink 5 can be increased in size or can be provided with fins, which can further increase the heat releasing effect thereof.

The heat transfer sheets 7 are sheets made of a resin with a material having a higher heat conductivity which is mixed therein and are inserted between two members for insulation therebetween and also for eliminating the gap therebetween for reducing the thermal resistance. The heat transfer sheets 7 are inserted between the main-substrate heatsink 5 and the power-supply rectification diode 3 and between the sub-substrate heatsinks 6 and the power transistors 4 for insulation therebetween and also for heat transfer with a higher efficiency. Further, in cases where the power-supply rectification diode 3 and the power transistors 4 are fully molded, it is also possible to employ silicon greases and the like, instead of the heat transfer sheets 7.

Next, with reference to FIGS. 2 to 5, there will be described a method for fabricating the semiconductor device according to the first embodiment.

At first, the main-substrate heatsink 5 is mounted to the power-supply rectification diode 3 with a screw. That is, one surface 5a of the main-substrate heatsink 5 is secured to the back surface 3b of the power-supply rectification diode 3 with the heat transfer sheet 7 interposed therebetween (see FIG. 2). Further, the sub-substrate heatsinks 6 are mounted to the power transistors 4 with screws. That is, the outer surface 61a of the one-side part 61 of each sub-substrate heatsink 6 is secured to back surfaces 4b of the two power transistors 4 with the heat transfer sheets 7 interposed therebetween (see FIG. 3).

Figure 4:
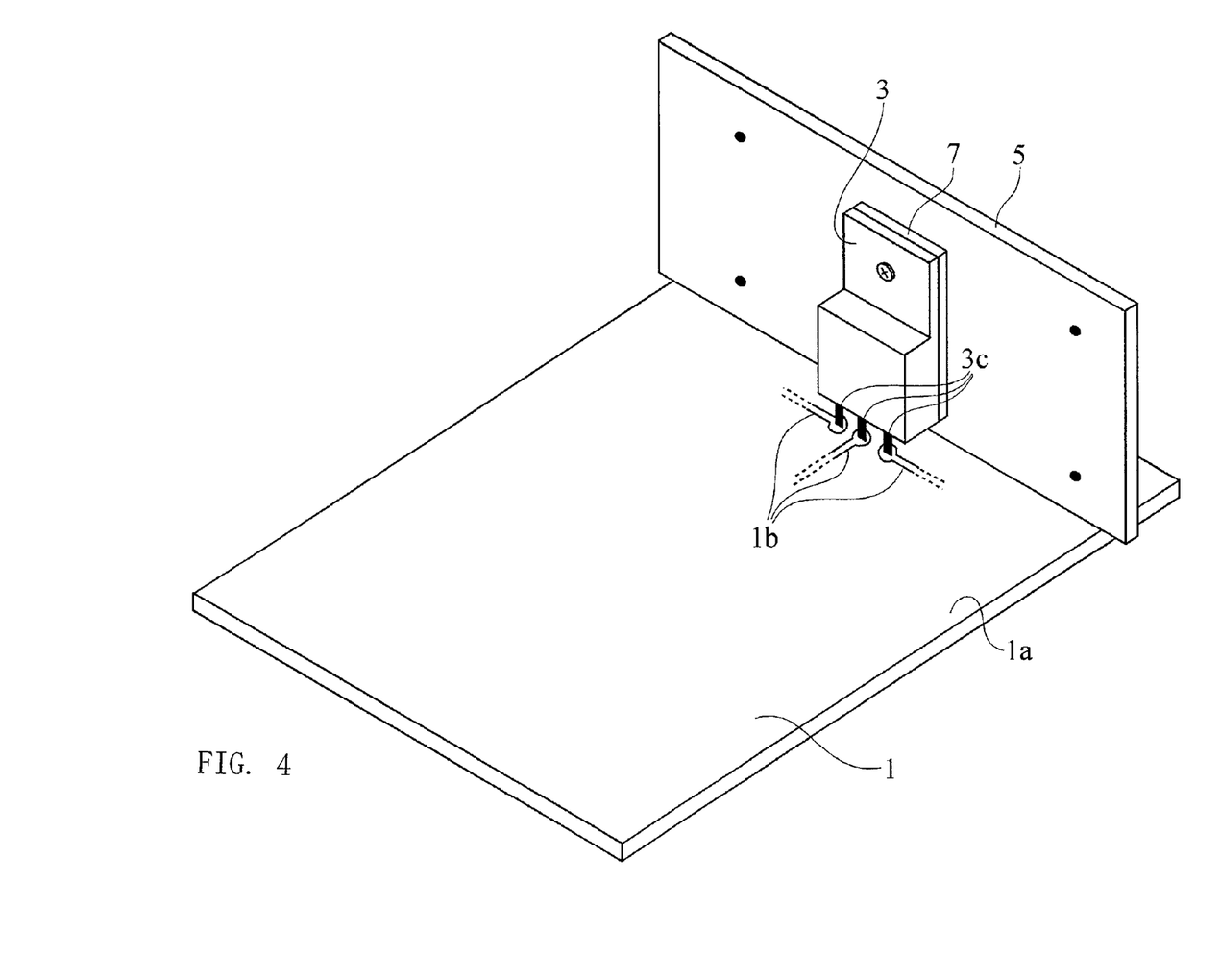
FIG. 4 is a view showing processes for mounting the power-supply rectification diode to a main substrate, in the example of the method for fabricating the semiconductor device shown in FIG. 1.

Next, the power-supply rectification diode 3 is mounted to the mounting surface 1a of the main substrate 1 (see FIG. 4). That is, respective terminals 3c of the power-supply rectification diode 3 are secured, by soldering, to the corresponding portions of the wiring patterns 1b provided on the mounting surface 1a of the main substrate 1. The other electronic components which are not illustrated are also mounted on the mounting surface 1a of the main substrate.

Figure 5:
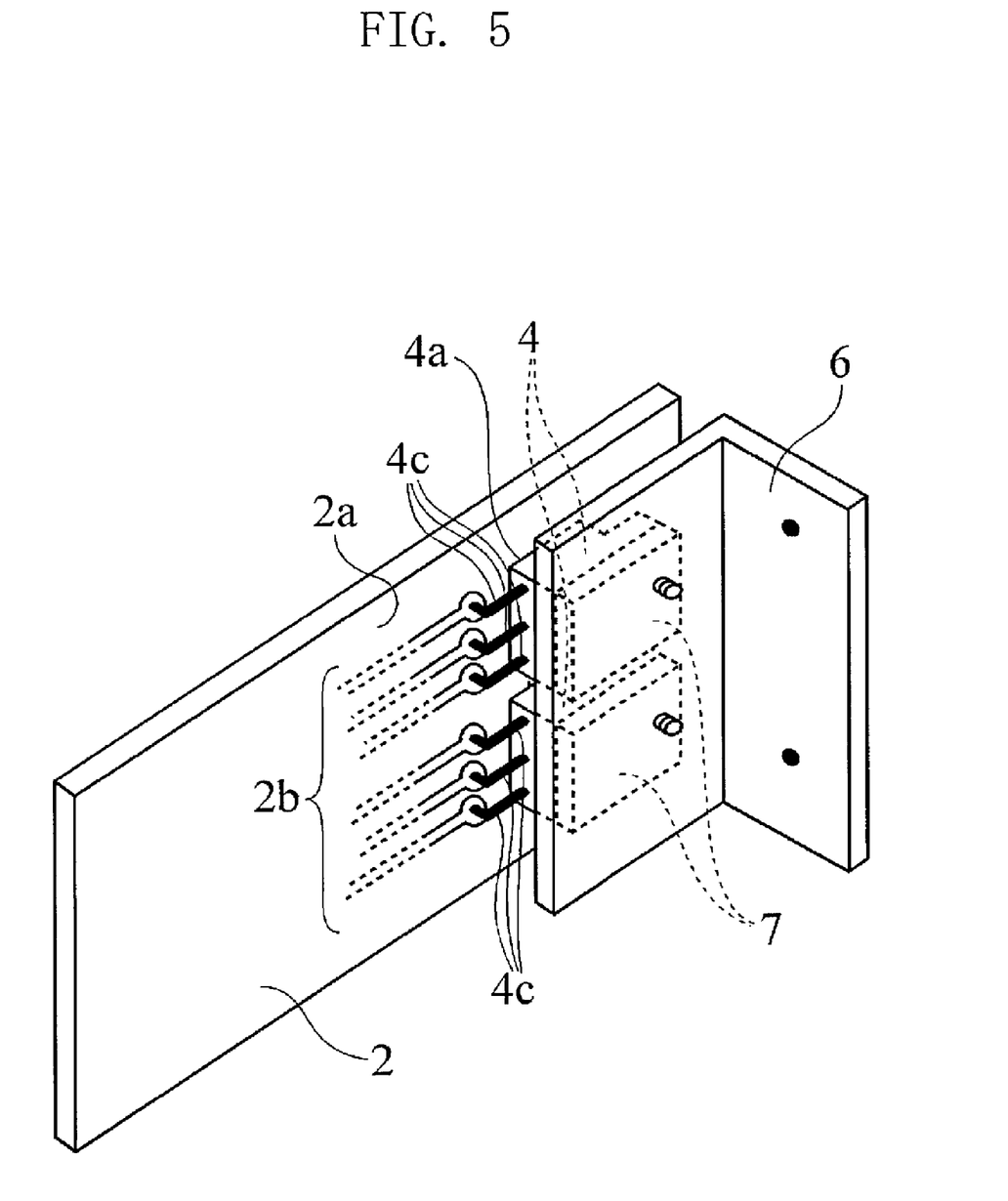
FIG. 5 is a view showing processes for mounting the power transistors to sub substrates, in the example of the method for fabricating the semiconductor device shown in FIG. 1.

Further, the two power transistors 4 which have been integrated through each sub-substrate heatsink 6 are mounted on the mounting surface 2a of the corresponding sub substrate 2 (see FIG. 5). That is, the respective terminals 4c of the power transistors 4 are secured by soldering to the corresponding portions of the wiring patterns 2b provided on the mounting surfaces 2a of the sub substrates 2. At this time, the surfaces 4a of the power transistors 4 are adhered to the mounting surfaces 2a of the sub substrates 2. The other electronic components which are not illustrated are also mounted on the mounting surfaces 2a of the sub substrates 2.

Next, the outer surfaces 62a of the other-side parts 62 of the sub-substrate heatsinks 6 are secured with screws to the one surface 5a of the main-substrate heatsink 5, such that the screw holes provided in the respective plates are coincident with each other (see FIG. 1). Next, the main substrate 1 and the sub substrate 2 are connected to each other through wirings. At last, the main substrate 1 is secured to the inner side of the chassis of the outer case which is not illustrated, and a lid of the outer case is secured to the chassis.

Next, effects of the semiconductor device according to the first embodiment will be described.

In the present embodiment, since the surfaces 4a of the power transistors 4 are adhered to the mounting surfaces 2a of the sub substrates 2, and the back surfaces 4b of the power transistors 4 are secured to the outer surfaces 61a of the one-side parts 61 of the sub-substrate heatsinks 6, the sub substrates 2 and the one-side parts 61 of the sub-substrate heatsinks 6 are secured in parallel to each other and the other-side parts 62 of the sub-substrate heatsinks 6 are secured orthogonally to the sub substrates 2. Further, since the power-supply rectification diode 3 is mounted in an upright state on the mounting surface 1a of the main substrate 1, and the back surface 3b of the power-supply rectification diode 3 is secured to the one surface 5a of the main-substrate heatsink 5, the main-substrate heatsink 5 is secured orthogonally to the main substrate 1. Accordingly, by securing the main-substrate heatsink 5 and the sub-substrate heatsinks 6 to each other with screws while placing them such that the screw holes provided and aligned in the main-substrate heatsink 5 in the direction of the shorter sides thereof are coincident with the screw holes provided and aligned in the other-side parts 62 of the sub-substrate heatsinks 6, the sub substrates 2 are orthogonally secured at predetermined positions on the mounting surface 2*a* of the main substrate 1.

As described above, in the present embodiment, the main-substrate heatsink 5 and the sub-substrate heatsinks 6, which have been originally used for releasing heat, are used for securing the sub substrates 2 to the main substrate 1, which therefore eliminates the necessity of using dedicated jigs or dedicated securing members. Accordingly, this can reduce the number of assembling processes, in comparison with cases of using dedicated jigs. Also, this can reduce the number of assembling processes and also can reduce the material cost, in comparison with cases of using dedicated securing members.

While, in the aforementioned embodiment, there has been described the case where the main substrate 1 is secured to the chassis of the outer case, the main-substrate heatsink 5 can be secured to the chassis of the outer case.

Figure 6:
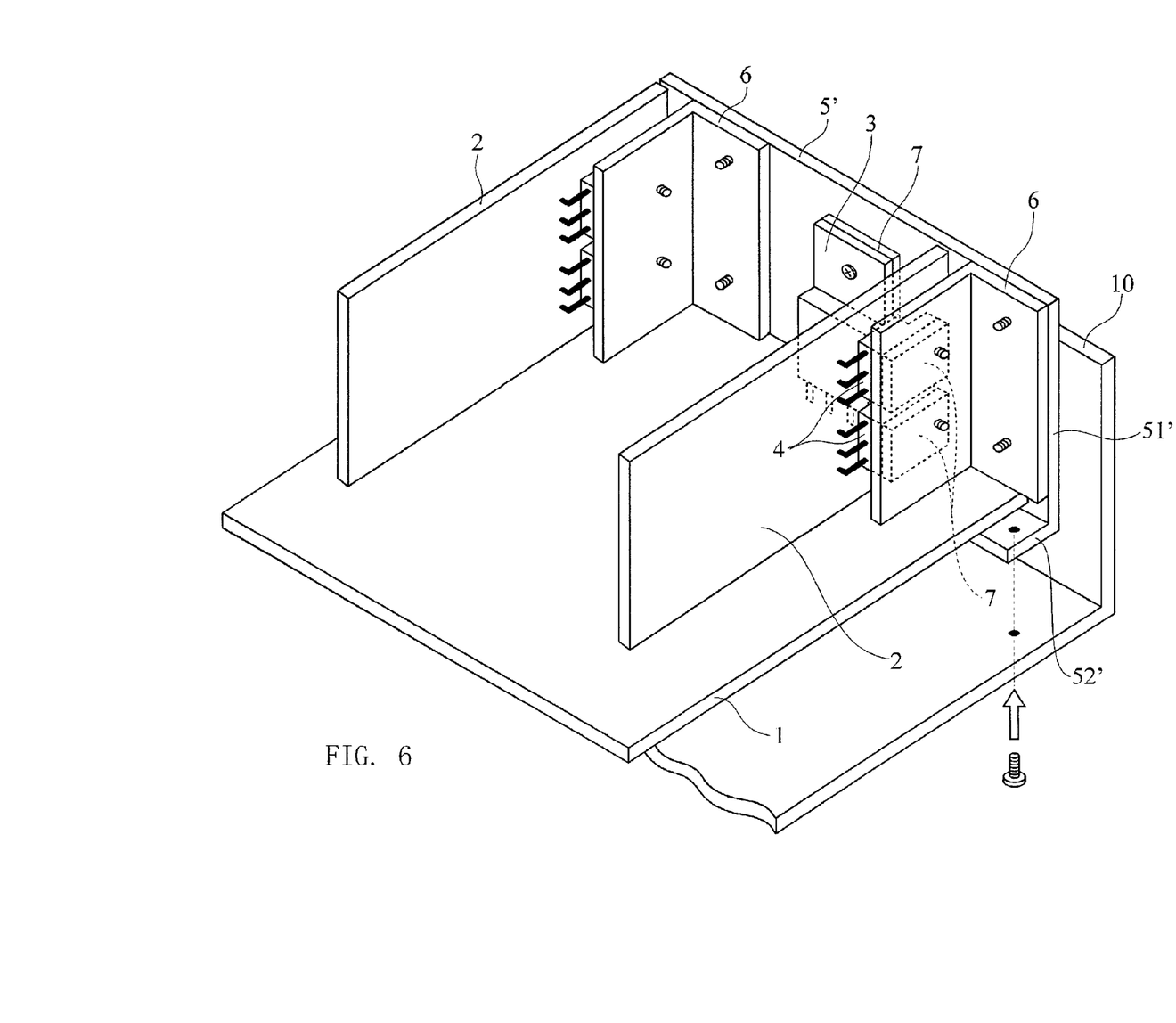
FIG. 6 is a view showing an internal structure of a second embodiment of a semiconductor device according to the present invention.

FIG. 6 is a view showing an internal structure of a second embodiment of a semiconductor device which is structured such that a main-substrate heatsink 5 is secured to a chassis of an outer case. In FIG. 6 there is illustrated a chassis 10 of the outer case, which is not illustrated in FIG. 1. In this illustration, the side surface of the chassis 10 (the surface at the front side in FIG. 6) is not illustrated. Further, identical or similar components to those of the first embodiment are designated by the same reference characters as those of the aforementioned first embodiment.

The present embodiment is different from the first embodiment, in the shape of the main-substrate heatsink 5'. The main-substrate heatsink 5' has an one-side part 51' corresponding to the main-substrate heatsink 5 according to the first embodiment and has an L-shaped cross-sectional area. In an other-side part (the lower portion in FIG. 2) 52' of the main-substrate heatsink 5', a single screw hole is formed near each of the opposite ends of the other-side part 52' in the direction of the border line between the one-side part 51' and the other-side part 52'. The main-substrate heatsink 5' is secured to the chassis 10 of the outer case at these screw holes.

The chassis 10 is a part of the outer case which holds the main substrate 1 and the sub substrates 2 and is shaped to be a box made of a metal capable of easily transferring heat therethrough, such as aluminum. Further, screw holes are formed in the chassis 10 at the positions which are coincident with the screw holes provided in the other-side part 52' of the main-substrate heatsink 5' when the main substrate 1 is placed thereon. Further the material and the shape of the chassis 10 are not limited to those described above. For example, the material thereof can be a metal such as iron or copper or a ceramic or resin having a lower thermal resistance. The shape thereof can be a plate shape, instead of a box shape, and a box-shaped lid can be secured to the chassis 10. Further, in cases where the chassis 10 is entirely formed from a material with a higher thermal resistance, it is possible to place heat releasing members with a lower thermal resistance at the portion of the chassis 10 which is secured to the main-substrate heatsink 5' and at the periphery thereof.

The method for fabricating the semiconductor device according to the second embodiment is the same as that in the first embodiment, except that the main-substrate heatsink 5, instead of the main substrate 1, is secured to the chassis 10 of the outer case and, therefore, is not described herein.

In the second embodiment, similarly, there is no need for using dedicated jigs or dedicated securing members for securing the sub substrates 2 to the main substrate 1. Further, since the main-substrate heatsink 5' is secured to the chassis 10 of the outer case, the chassis 10 of the outer case also functions as a heat releasing member. This can efficiently release heat generated from the heat generating devices, such as the power-supply rectification diode 3 and the power transistors 4.

Further, the method for securing the main-substrate heatsink 5' to the chassis 10 of the outer case is not limited to the aforementioned method, and a heat transfer sheet 7 can be interposed therebetween or they can be secured to each other through other methods than securing with screws. For example, the main-substrate heatsink 5' can be directly adhered to the chassis 10 with an adhesive agent with a lower thermal resistance or can be secured to the chassis 10 by soldering or welding. Further, the shape of the main-substrate heatsink 5' is not limited. Also, the main-substrate heatsink 5' can be secured to the lid of the outer case, or the sub-substrate heatsinks 6 can be secured to the chassis 10 or the lid of the outer case.

While, in the aforementioned embodiments, there have been described the cases where the surfaces 4*a* of the power transistors 4 are adhered to the mounting surfaces 2*a* of the sub substrates 2, the power transistors 4 can be mounted to the sub substrates 2 such that the surfaces 4*a* and the back surfaces 4*b* thereof are perpendicular to the mounting surfaces 2*a* of the sub substrates 2.

Figure 7:
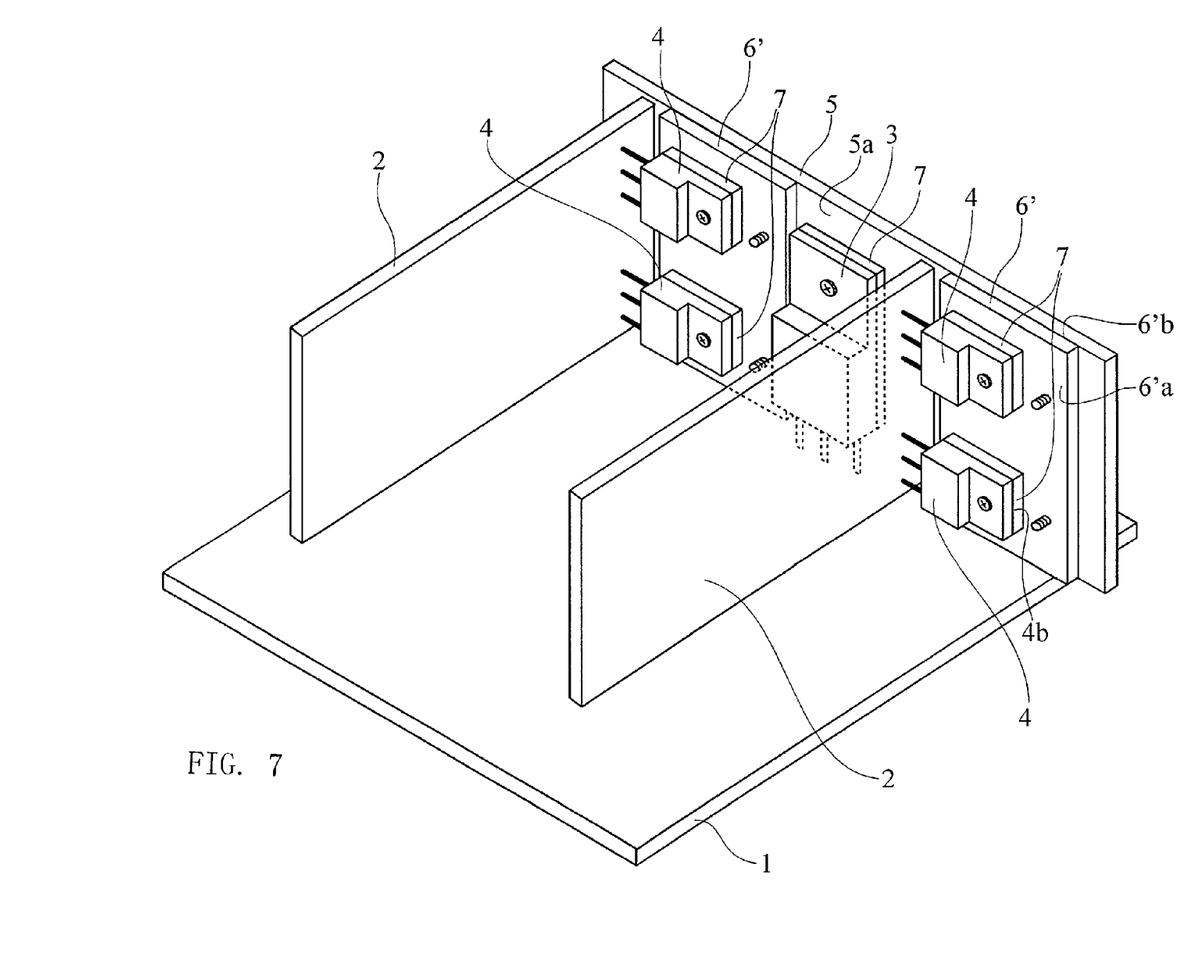
FIG. 7 is a view showing an internal structure of a third embodiment of a semiconductor device according to the present invention.

FIG. 7 is a view showing an internal structure of a third embodiment of a semiconductor device which is adapted such that power transistors 4 are mounted to sub substrates 2 such that the surfaces 4*a* and the back surfaces 4*b* thereof are perpendicular to the mounting surfaces 2*a* of the sub substrates 2. In FIG. 7, identical or similar components to those of the first embodiment are designated by the same reference characters as those of the first embodiment.

The present embodiment is different from the first embodiment, in the method for mounting the power transistors 4 to the sub substrates 2 and in the shape of sub-substrate heatsinks 6'. The power transistors 4 are mounted to the sub substrates 2 such that the surfaces 4*a* and the back surfaces 4*b* thereof are perpendicular to the mounting surfaces 2*a* of the sub substrates 2. The sub-substrate heatsinks 6' have a rectangular shape and are secured with screws to the back surfaces 4*b* of the power transistors 4 with heat transfer sheets 7 interposed therebetween, at one surfaces 6'*a* thereof (the surfaces at the front side in FIG. 7). Further, the sub-substrate heatsinks 6' are secured with screws to the one surface 5*a* of the main-substrate heatsink 5, at the other surfaces 6'*b* thereof (the surfaces at the back side in FIG. 7). Further, the shape of the sub-substrate heatsinks 6' is not limited to the aforementioned shape. The fabricating method thereof is the same as that of the first embodiment and, therefore, is not described herein.

While, in the third embodiment, the main-substrate heatsink 5 and the sub-substrate heatsinks 6', which have been originally used for releasing heat, are used for securing the sub substrates 2 to the main substrate 1, which therefore eliminates the necessity of using dedicated jigs or dedicated securing members for securing the sub substrates 2 to the main substrate 1. Accordingly, this can reduce the number of assembling processes and also can reduce the material cost.

Further, in the third embodiment, the other surfaces 6'*b* of the sub-substrate heatsinks 6 are entirely contacted with the main-substrate heatsink 5, which can offer an advantage of making the efficient of the heat transfer from the sub-substrate heatsinks 6' to the main-substrate heatsink 5 to be higher than those in the first and second embodiments.

Further, in the third embodiment, the sub-substrate heatsinks 6' and the sub substrates 2 are secured to each other only with the respective terminals 4c of the power transistors 4, which may make it difficult to maintain the sub-substrates heatsinks 6' perpendicular to the sub substrates 2 in some cases. In such cases, in order to secure them more firmly, it is possible to provide a structure for directly securing the sub-substrate heatsinks 6' to the sub substrates 2.

Figure 8:
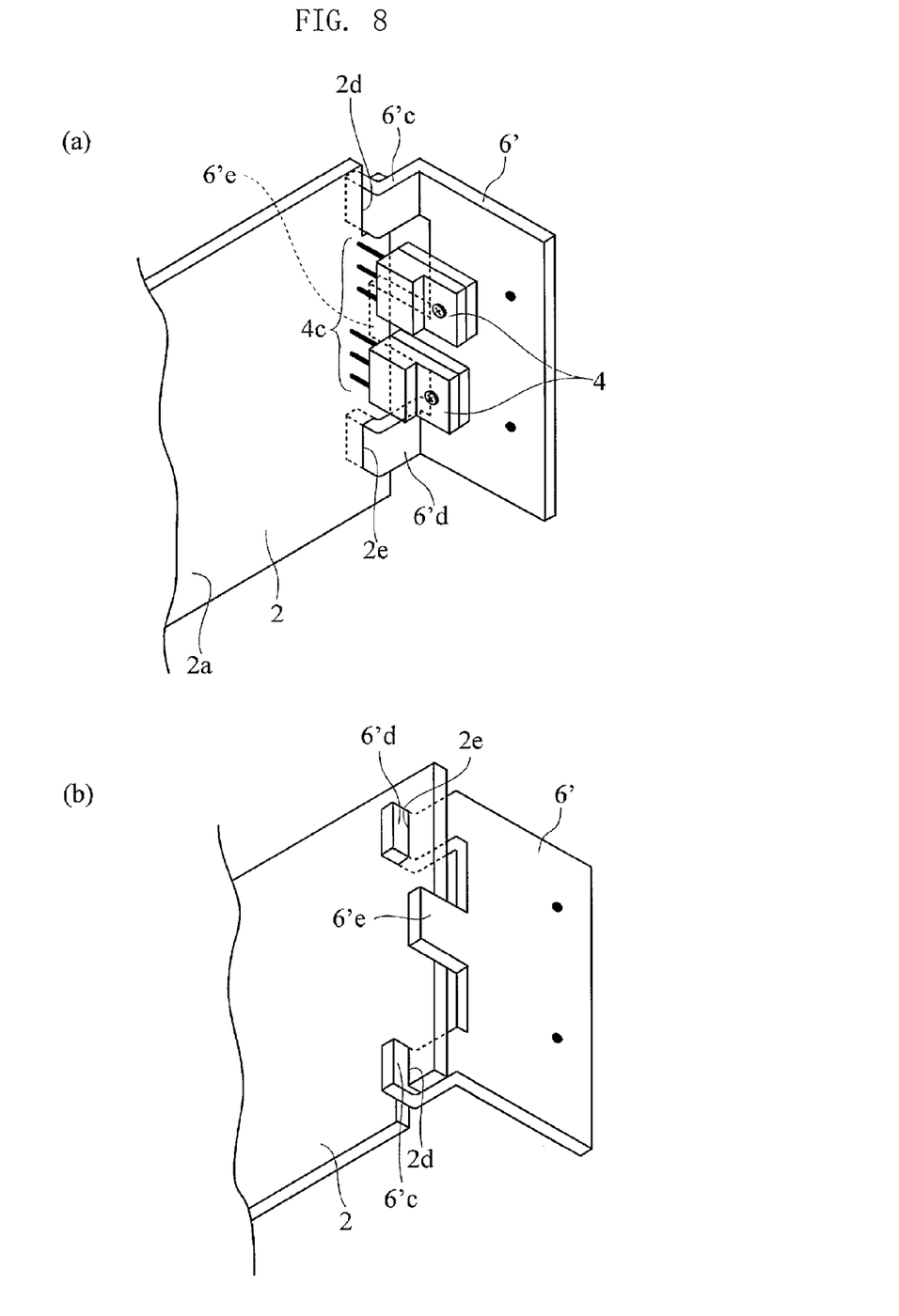
FIGS. 8A and 8B are views showing an example of directly securing sub-substrate heatsinks to sub substrates.

FIG. 8 shows an example of provision of a structure for directly securing the sub-substrate heatsinks 6' to the sub substrates 2. FIG. 8(*a*) is a view showing a sub substrate 2 to which a sub-substrate heatsink 6 is directly secured, viewed from the side of the mounting surface 2a of the sub substrate 2, and FIG. 8(*b*) is a view showing the sub substrate 2, viewed from the side opposite therefrom.

In this example, the one end portion of the sub-substrate heatsink 6' which is mounted to the sub substrate 2 is provided with two engagement portions 6'c and 6'd at the opposite outer portions to which the power-transistors 4 are not mounted and also is provided with a collar portion 6'e. The engagement portions 6'c and 6'd are formed to have an L-shaped cross-sectional area, that is they includes a first extending portion extended from the sub-substrate heatsink 6' in parallel to the sub substrate 2 and a second extending portion extended from the first extending portion perpendicularly to the sub substrate 2. The collar portion 6'e includes a third extending portion extended from the sub-substrate heatsink 6' perpendicularly to the sub substrate 2. The sub-substrate heatsink 6' is formed to have the aforementioned shape, since the power transistors 4 are mounted to the sub substrates 2 orthogonally thereto and, therefore, the sub-substrate heatsink 6' can not be entirely formed to have an L-shaped cross-sectional area. Further, the sub substrate 2 is provided with an engagement slit 2d and an engagement hole 2e. In the case of mounting, to the sub substrate 2, the power transistors 4 to which the sub-substrate heatsink 6' has been mounted, the engagement portion 6'c and the engagement portion 6'd are inserted and engaged in the engagement slit 2d and the engagement hole 2e, respectively, and the sub-substrate heatsink 6' and the sub substrate 2 are secured to each other such that the engagement portions 6'c and 6'd and the collar portion 6'e sandwich the end portion of the sub substrate 2. Next, the respective terminals 4c of the power transistors 4 are adhered, by soldering, to the corresponding portions of the wiring patterns 2b on the sub substrate 2. Thus, the sub-substrate heatsink 6' and the sub substrate 2 are secured to each other, more firmly than in cases of securing them only at the respective terminals 4c of the power transistors 4. Further, the method for securing the sub-substrate heatsink 6' and the sub substrate 2 to each other is not limited to the aforementioned method, and they can be secured to each other with screws and the like or can be adhered to each other with an adhesive agent or the like.

Further, even in the case where the surface 3a of the power-supply rectification diode 3 has been mounted by adhesion to the mounting surface 1a of the main substrate 1, the main-substrate heatsink 5 and the sub-substrate heatsinks 6 can be secured to each other, by changing the shape of the main-substrate heatsink 5. This can offer the same effects as those of the first embodiment.

In the aforementioned embodiment, the heat transfer sheets 7 are interposed between the power transistors 4 and the sub-substrate heatsinks 6. The heat transfer sheets 7 are made of an insulation material, but have a permittivity which is not zero, which causes the power transistors 4 and the sub-substrate heatsinks 6 to be capacitively coupled to each other. Accordingly, when the power transistors 4 perform switching operations at high speeds, an electric current and a voltage variation are generated in the sub-substrate heatsinks 6 through the heat transfer sheets 7, thereby radiation of electromagnetic waves are induced. In order to prevent this phenomenon, the sub-substrate heatsinks 6 can be grounded, which requires a member for electrically connecting the sub-substrate heatsinks 6 to ground patterns provided on the sub substrates 2.

On the other hand, a temperature sensor for monitoring the temperature at the power transistors 4 is mounted on the sub substrate 2. The temperature sensor is mounted thereon such that it is surrounded by a heat conducting member for transferring heat from the corresponding sub-substrate heatsink 6 to the temperature sensor and is used for monitoring the temperature at the power transistors 4 which is transferred thereto through the heat conducting member and the sub-substrate heatsink 6. In FIG. 1, the temperature sensor and the heat conducting member are not illustrated.

This heat conducting member can be used as a member for electrically connecting the sub-substrate heatsink 6 to the ground pattern provided on the sub substrate 2, which can prevent radiation of electromagnetic waves, without using additional new members.

Figure 9:
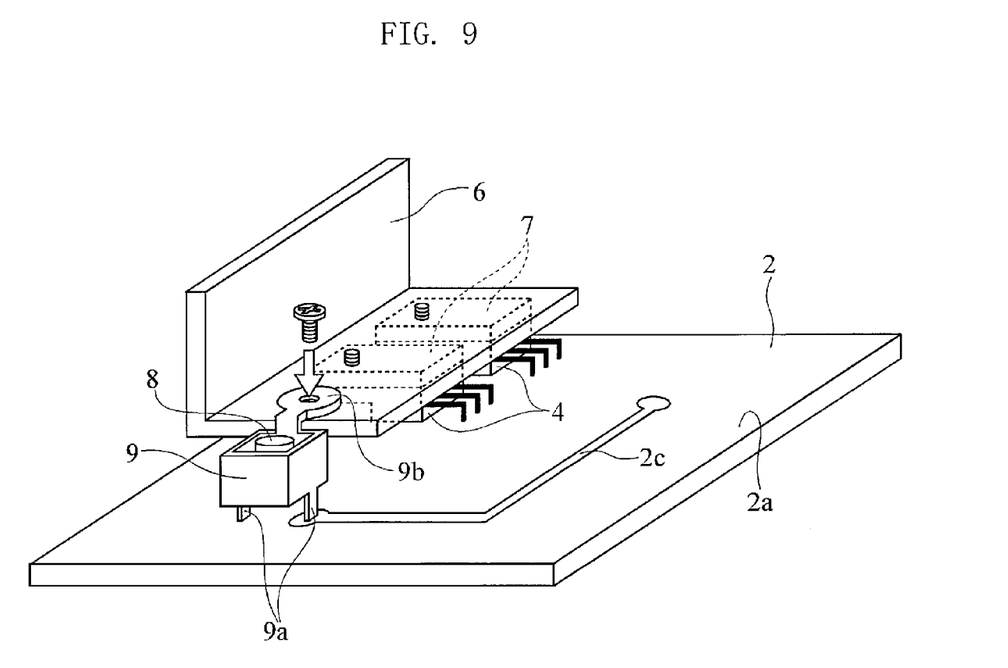
FIG. 9 is a view showing an internal structure of a fourth embodiment of a semiconductor device according to the present invention.

FIG. 9 is a view showing an internal structure of a fourth embodiment of a semiconductor device which employs a heat conducting member 9 as a member for electrically connecting a sub-substrate heatsink 6 to the ground pattern provided on a sub substrate 2. In FIG. 9, the main substrate 1, the power supply rectification diode 3, the main-substrate heatsink 5 and the outer case are not illustrated, but a temperature sensor 8 and a heat conducting member 9 which are not illustrated in FIG. 1 are illustrated. Further, identical or similar components to those in the first embodiment are designated by the same reference characters as those of the first embodiment.

The present embodiment is different from the first embodiment, in that a ground pattern 2c is provided on the mounting surface 2a of the sub substrate 2, and the heat conducting member 9 is connected to the ground pattern 2c.

The temperature sensor 8 is a thermistor which is mounted on the mounting surface 2a of the sub substrate 2 and changes its resistance value with the ambient temperature. Further, the temperature sensor 8 is not limited to a thermistor and can be a thermocouple or other sensors (such as a sensor IC which changes its output voltage).

The heat conducting member 9 is a rectangular cylindrical member which is made of a metal with a lower thermal resistance, such as aluminum. The heat conducting member 9 is provided with terminals 9a to be mounted to the sub substrate 2 at one end portion thereof (the lower end portion in FIG. 9) and, further, is provided with a connection portion 9b having a screw hole to be secured to the corresponding sub-substrate heatsink 6, at the other end portion (the upper end portion in FIG. 9). The heat conducting member 9 is mounted to the mounting surface 2a of the sub substrate 2, such that it surrounds the temperature sensor 8, and one of the terminals 9a is connected to the ground pattern 2c on the sub substrate 2. The connection portion 9b of the heat conducting member 9 is secured to the sub-substrate heatsink 6 with a screw. Thus, the heat conducting member 9 has the function of transferring the temperature of the power transistors 4 secured to the sub-substrate heatsink 6 to the temperature sensor 8. Further, the method for securing the connection portion 9b to the sub-substrate heatsink 6 is not limited to securing with a screw, but is limited to methods which enable transferring heat and electricity. Further, the shape and the material of the heat conducting member 9 are not limited to those described above, but the material thereof is required to have a lower thermal resistance and to be electrically conductive.

A CPU, which is not illustrated, monitors the resistance value of the temperature sensor 8. If the resistance value exceeds a predetermined value, the CPU determines that the temperature of the power transistors 4 exceeds the predetermined value and stops the operation of the semiconductor device, in order to prevent corruption and thermal runaway of the power transistors 4.

In the present embodiment, similarly, it is possible to offer the same effects as those of the first embodiment. Further, the sub-substrate heatsink 6 is electrically connected to the ground pattern 2c through the heat conducting member 9. This can prevent the occurrence of radiation of electromagnetic waves in the sub-substrate heatsinks 6. As described above, in the present embodiment, the heat conducting member 9, which has been originally provided for monitoring the temperature of the power transistors 4, is used as a member for grounding the sub-substrate heatsink 6, which therefore eliminates the necessity of using additional new members for preventing the occurrence of radiation of electromagnetic waves generated by the sub-substrate heatsinks 6.

Further, in cases where the terminals 9a of the heat conductive member 9 can not be connected to the ground pattern 2c through wiring patterns, a wiring pattern connected to the terminals 9a of the heat conducting member 9 can be connected to the ground pattern 2c through a jumper lead. Also, as a countermeasure against radiation, it is possible to connect them through resistances or condensers, instead of jumper leads.

The semiconductor device according to the present invention is not limited to the aforementioned embodiments. Various types of design changes can be made to the concrete structures of the respective portions of the semiconductor device according to the present invention.

What is claimed is:

1. A semiconductor device including a main substrate and one or more sub substrates, the semiconductor device comprising:

first heat generating devices mounted on the sub substrates;
sub-substrate heatsinks mounted to the first heat generating devices; and
a main-substrate heatsink mounted to the main substrate;
wherein the sub-substrate heatsinks and the main-substrate heatsink are secured to each other, such that the sub substrates and the main substrate are positioned orthogonally to each other; and
the sub-substrate heatsinks have an L-shaped cross-sectional area, are mounted, at their one end portions, to the first heat generating devices such that the one end portions are parallel to the sub substrates and, also, are secured, at the other end portions, to the main-substrate heatsink.

2. The semiconductor device according to claim 1, further comprising a second heat generating device mounted on the main substrate,
wherein the main-substrate heatsink is mounted to the second heat generating device.

3. The semiconductor device according to claim 1, wherein the main-substrate heatsink is directly mounted to the main substrate.

4. The semiconductor device according to claim 1, wherein the first heat generating devices are mounted on the sub substrates in parallel to the sub substrates.

5. The semiconductor device according to claim 1, further comprising a chassis to which the sub-substrate heatsinks or the main-substrate heatsink is secured.

6. The semiconductor device according to claim 1, further comprising a heat conducting portion for transferring heat to a temperature sensor which is secured to the sub-substrate heatsinks or the main-substrate heatsink,
wherein the heat conducting portion is grounded.

7. The semiconductor device according to claim 1, wherein each of the sub substrates is an amplifier substrate for a single channel and, when the semiconductor device comprises amplifiers for plural channels, the sub substrates and the sub-substrate heatsinks for the plural channels are provided.

* * * * *